(12) United States Patent
Miyake et al.

(10) Patent No.: US 9,401,407 B2
(45) Date of Patent: Jul. 26, 2016

(54) TRANSISTOR

(75) Inventors: Hiroyuki Miyake, Kanagawa (JP);
Masayo Kayama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 718 days.

(21) Appl. No.: 13/076,806

(22) Filed: Mar. 31, 2011

(65) Prior Publication Data

US 2011/0248266 A1    Oct. 13, 2011

(30) Foreign Application Priority Data

Apr. 7, 2010 (JP) ................................ 2010-088634

(51) Int. Cl.
*H01L 29/04* (2006.01)
*H01L 29/417* (2006.01)
*H01L 29/786* (2006.01)

(52) U.S. Cl.
CPC ...... *H01L 29/41733* (2013.01); *H01L 29/7869* (2013.01)

(58) Field of Classification Search
CPC ................................................. H01L 29/41733
See application file for complete search history.

(56) References Cited

U.S. PATENT DOCUMENTS

| 5,302,987 | A | * | 4/1994 | Kanemori et al. ............ 349/143 |
| 5,731,856 | A | | 3/1998 | Kim et al. |
| 5,744,864 | A | | 4/1998 | Cillessen et al. |
| 5,986,306 | A | | 11/1999 | Nakajima et al. |
| 6,294,274 | B1 | | 9/2001 | Kawazoe et al. |
| 6,563,174 | B2 | | 5/2003 | Kawasaki et al. |
| 6,727,522 | B1 | | 4/2004 | Kawasaki et al. |
| 7,019,457 | B2 | | 3/2006 | Fukunaga |
| 7,049,190 | B2 | | 5/2006 | Takeda et al. |
| 7,061,014 | B2 | | 6/2006 | Hosono et al. |
| 7,064,346 | B2 | | 6/2006 | Kawasaki et al. |
| 7,105,868 | B2 | | 9/2006 | Nause et al. |
| 7,211,825 | B2 | | 5/2007 | Shih et al. |

(Continued)

FOREIGN PATENT DOCUMENTS

| EP | 1 737 044 A1 | 12/2006 |
| EP | 2136406 A | 12/2009 |

(Continued)

OTHER PUBLICATIONS

International Search Report (Application No. PCT/JP2011/056489) Dated Jun. 28, 2011, in English.

(Continued)

*Primary Examiner* — Matthew W Such
*Assistant Examiner* — Abul Kalam
(74) *Attorney, Agent, or Firm* — Fish & Richardson P.C.

(57) ABSTRACT

An object is to provide a transistor having a novel electrode structure capable of substantially maintaining on-state current while parasitic capacitance generated in an overlap portion between a source electrode layer (a drain electrode layer) and a gate electrode layer is reduced. Parasitic capacitance is reduced by using a source electrode layer and a drain electrode in a comb shape in a transistor. Curved current flowing from side edges of electrode tooth portions can be generated by controlling the width of an end of a comb-shaped electrode layer or the interval between the electrode tooth portions. This curved current compensates for a decrease in linear current due to a comb electrode shape; thus, on-state current can be kept unchanged even when parasitic capacitance is reduced.

27 Claims, 9 Drawing Sheets

(56) References Cited

U.S. PATENT DOCUMENTS

| | | | |
|---|---|---|---|
| 7,230,375 B2 | 6/2007 | Park et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,462,865 B2 | 12/2008 | Jung et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,704,768 B2 * | 4/2010 | Jang et al. | 438/30 |
| 7,732,819 B2 | 6/2010 | Akimoto et al. | |
| 7,825,586 B2 * | 11/2010 | Park et al. | 313/505 |
| 7,851,836 B2 * | 12/2010 | Matsumoto et al. | 257/290 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0012097 A1 | 1/2005 | Yamazaki | |
| 2005/0017302 A1 | 1/2005 | Hoffman | |
| 2005/0041168 A1 * | 2/2005 | Jang et al. | 349/43 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0147104 A1 | 6/2007 | Kato et al. | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0285593 A1 | 12/2007 | Yamashita | |
| 2007/0287296 A1 | 12/2007 | Chang | |
| 2008/0006877 A1 | 1/2008 | Mardilovich et al. | |
| 2008/0038882 A1 * | 2/2008 | Takechi et al. | 438/151 |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0157136 A1 * | 7/2008 | Matsumoto et al. | 257/290 |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0075440 A1 | 3/2009 | Jung et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0283762 A1 | 11/2009 | Kimura | |
| 2009/0315026 A1 | 12/2009 | Jeong et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0095288 A1 | 4/2011 | Morosawa et al. | |

FOREIGN PATENT DOCUMENTS

| | | |
|---|---|---|
| EP | 2 226 847 A2 | 9/2010 |
| JP | 60-054171 | 4/1985 |
| JP | 60-198861 A | 10/1985 |
| JP | 62-287666 A | 12/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-360583 A | 12/1992 |
| JP | 05-183165 A | 7/1993 |
| JP | 05183165 A | 7/1993 |
| JP | 05-251705 A | 9/1993 |
| JP | 08-015728 A | 1/1996 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-209070 A | 8/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-006342 A | 1/2004 |
| JP | 2004-103957 A | 4/2004 |
| JP | 2004-273614 A | 9/2004 |
| JP | 2004-273732 A | 9/2004 |
| JP | 2007-156494 A | 6/2007 |
| JP | 2007-310180 A | 11/2007 |
| JP | 2008-166318 A | 7/2008 |
| JP | 2009-302520 A | 12/2009 |
| JP | 2010-004000 A | 1/2010 |
| JP | 2010-016163 A | 1/2010 |
| WO | 2004/114391 A1 | 12/2004 |
| WO | WO-2008/084650 | 7/2008 |

OTHER PUBLICATIONS

Written Opinion (Application No. PCT/JP2011/056489) Dated Jun. 28, 2011, in English.

Asakuma, N et al., "Crystallization and Reduction of SOL-GEL-Derived Zinc Oxide Films by Irradiation With Ultraviolet Lamp," Journal of SOL-GEL Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

(56) References Cited

OTHER PUBLICATIONS

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology ," IEDM 05: Technical Digest of International Electron Devices Meeting, Dec. 5, 2005, pp. 1067-1069.

Fortunato, E et al., "Wide-Bandgap High-Mobility ZnO Thin-Film Tansistors produced at Room Temperature,"Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide—Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

(56) References Cited

OTHER PUBLICATIONS

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate insulator," Appl. Phys. Lett. (Applied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

TRANSISTOR

TECHNICAL FIELD

The present invention relates to transistors, and an embodiment of the present invention relates to the shape of electrodes of transistors.

BACKGROUND ART

The development of informatization has called attention to the development of an electronic paper display which is thin and lightweight and is an alternative to paper, an IC tag which enables each product to be identified instantly, or the like. In addition, liquid crystal display devices are widely used for display devices ranging from large-sized display devices such as television sets to small-sized display devices such as mobile phones. As these devices widely spread, development has been conducted to reduce cost and add higher values. In particular, in recent years, the global environment has received increasing attention, and the development of a device capable of operating with less power consumption and at higher speed has been attracting attention.

In these devices, transistors are currently used as elements. A transistor is an element in which regions called a source and a drain are provided in a semiconductor and connected to respective electrodes, potentials are supplied to the electrodes, and an electric field is applied to the semiconductor with the use of an electrode called a gate through an insulating layer or a Schottky barrier so that the state of the semiconductor is controlled, whereby current flowing between the source electrode and the drain electrode is controlled.

In order to realize a device capable of operating with less power consumption and at higher speed, a transistor having a higher on/off ratio and a smaller parasitic capacitance is needed. The on/off ratio refers to the ratio of on-state current to off-state current ($I_{ON}/I_{OFF}$), and the higher the on/off ratio is, the better the switching characteristics are. Note that the on-state current is a current which flows between a source electrode and a drain electrode when a transistor is turned on, and the off-state current is a current which flows between a source electrode and a drain electrode when a transistor is turned off. For example, in the case of an n-channel transistor, the off-state current is a current which flows between a source electrode and a drain electrode when gate voltage is lower than threshold voltage of the transistor. The parasitic capacitance is a capacitance generated in an overlap portion between a source electrode (a drain electrode) and a gate electrode, and an increase in parasitic capacitance leads to an increase in switching time or a decrease in transfer gain for AC signals.

The parasitic capacitance of a transistor varies depending on the area of an overlap portion between a source electrode (a drain electrode) and a gate electrode. By decreasing this area, the parasitic capacitance can be reduced. However, there is a trade-off between the decrease in area and manufacturing cost, and it is very difficult to balance the two.

The on-state current of a transistor varies depending on the length and width of a channel formation region. The length of a channel formation region corresponds to the interval between an edge of a source electrode and an edge of a drain electrode which face each other. By decreasing this length, the on-state current can be increased. The width of the channel formation region corresponds to the length along which the source electrode and the drain electrode face each other. By increasing this width, the on-state current can be increased. For example, a transistor structure is disclosed (see, for example, Patent Document 1) in which a source electrode and a drain electrode of a transistor each have a comb shape and interdigitate with each other so that the transistor can have a channel formation region with a larger width and can be tolerant of a misalignment between the source electrode (the drain electrode) and a gate electrode. However, in such a structure, the area of the overlap between the source electrode (the drain electrode) and the gate electrode is large, which causes an increase in parasitic capacitance. If the area of the overlap between the source electrode (the drain electrode) and the gate electrode is decreased in order to reduce the parasitic capacitance, the on-state current is decreased.

Furthermore, an excessive increase in length of the channel formation region causes the problem of a drastic decrease in the on-state current. In order to maintain the on-state current at a certain value or more, it is important to maintain at a certain value or less the length of the channel formation region (which may alternatively be the length of the overlap portion between the source (drain) electrode and the gate electrode, when the gate width is constant). In other words, a transistor which allows the area of the overlap portion to be decreased without changing the length of the channel formation region (without changing the length of the overlap portion between the source (drain) electrode and the gate electrode, when the gate width is constant) is necessary.

REFERENCE

[Patent Document 1] Japanese Published Patent Application No. S62-287666

DISCLOSURE OF INVENTION

In view of the above problems, it is an object of an embodiment of the present invention to suppress a decrease in on-state current, as well as to reduce parasitic capacitance generated in an overlap portion between a source electrode (a drain electrode) and a gate electrode.

The above object is achieved with a source electrode layer and a drain electrode layer in a comb shape in a transistor.

An embodiment of the present invention is a transistor including: a source electrode layer in a comb shape, which includes electrode tooth portions arranged adjacently at a predetermined interval and a connection portion for connecting the electrode tooth portions; and a drain electrode layer in a comb shape, which includes electrode tooth portions arranged adjacently at a predetermined interval and a connection portion for connecting the electrode tooth portions. The source electrode layer and the drain electrode layer are disposed such that the electrode tooth portions of the source electrode layer and the electrode tooth portions of the drain electrode layer face each other without interdigitating with each other. An end of one of the electrode tooth portions of the source electrode layer and an end of one of the electrode tooth portions of the drain electrode layer face each other. This structure is hereinafter referred to as Structure A. The end of the electrode tooth portion of the source electrode layer and the end of the electrode tooth portion of the drain electrode layer may face each other along the same length.

An embodiment of the present invention is a transistor including: a source electrode layer in a comb shape, which includes electrode tooth portions arranged adjacently at a predetermined interval and a connection portion for connecting the electrode tooth portions; and a drain electrode layer in a comb shape, which includes electrode tooth portions arranged adjacently at a predetermined interval and a connection portion for connecting the electrode tooth portions. The source electrode layer and the drain electrode layer are disposed such that the electrode tooth portions of the source electrode layer and the electrode tooth portions of the drain electrode layer face each other without interdigitating with each other. An end of one of the electrode tooth portions of the source electrode layer and an end of one of the electrode tooth portions of the drain electrode layer face each other along a length different from a length of the end of the electrode tooth portion of the source electrode layer or a length of the end of the electrode tooth portion of the drain electrode layer (misaligned with each other). This structure is hereinafter referred to as Structure B.

An embodiment of the present invention is a transistor including: a source electrode layer in a comb shape, which includes electrode tooth portions arranged adjacently at a predetermined interval and a connection portion for connecting the electrode tooth portions; and a drain electrode layer in a rectangular shape. The source electrode layer and the drain electrode layer are disposed such that the drain electrode layer and the electrode tooth portions of the source electrode layer face each other. This structure is hereinafter referred to as Structure C.

An embodiment of the present invention is a transistor including: a drain electrode layer in a comb shape, which includes electrode tooth portions arranged adjacently at a predetermined interval and a connection portion for connecting the electrode tooth portions; and a source electrode layer in a rectangular shape. The source electrode layer and the drain electrode layer are disposed such that the source electrode layer and the electrode tooth portions of the drain electrode layer face each other. This structure is hereinafter referred to as Structure C.

Any of the above transistors may include a gate electrode layer, a gate insulating layer in contact with the gate electrode layer, and a semiconductor layer overlapping with the gate electrode layer with the gate insulating layer interposed therebetween. An edge of the source electrode layer may be in contact with one side of the semiconductor layer and may overlap with the gate electrode layer with the gate insulating layer and the semiconductor layer interposed therebetween. An edge of the drain electrode layer may be in contact with the one side of the semiconductor layer and may overlap with the gate electrode layer with the gate insulating layer and the semiconductor layer interposed therebetween.

In some of the above transistors, the connection portion of the source electrode layer (comb-shaped electrode layer) and the gate electrode layer do not overlap each other. In addition, the connection portion of the drain electrode layer (comb-shaped electrode layer) and the gate electrode layer do not overlap each other.

In some of the above transistors, the width of the end of the source electrode layer in the comb shape may be 3/8 to 1/1 of the width of the source electrode layer and 3/8 to 8/3 of the width of the drain electrode layer.

In some of the above transistors, the width of the end of the drain electrode layer in the comb shape may be 3/8 to 1/1 of the width of the drain electrode layer and 3/8 to 8/3 of the width of the source electrode layer.

In any of the above transistors, the interval between the electrode tooth portions may be greater than 0 μm and less than or equal to 5 μm.

Note that if the transistors do not satisfy the above conditions, the on-state current may be decreased beyond the acceptable range. In this specification, a decrease of approximately several percent of on-state current also means that the on-state current is maintained.

Terms used in this specification are briefly described here. In this specification, the term "comb shape" refers to any shape that includes a depressed portion and a projecting portion. The term "comb-shaped electrode layer" refers to a whole source (drain) electrode layer including a depressed portion and a projecting portion at one edge. The term "end (also referred to top edge) of a comb-shaped electrode layer (a source electrode layer or a drain electrode layer)" refers to all ends of the electrode tooth portions of the source (drain) electrode layer, which are parallel to an edge of the connection portion and overlapping with the gate electrode layer, excluding the edge of the connection portion. The term "width of an end of a comb-shaped electrode layer" refers to the sum of the lengths of all ends of the electrode tooth portions of the source (drain) electrode layer, parallel to an edge of the connection portion and overlapping with the gate electrode layer, excluding the edge of the connection portion. The term "interval between electrode tooth portions" refers to the length of an edge of a gate electrode layer in a region where the gate electrode layer and a source (drain) electrode layer do not overlap each other, from a point where the edge of the gate electrode layer intersects one electrode tooth portion of the source (drain) electrode layer overlapping with the gate electrode layer to a point where the edge of the gate electrode layer intersects the next electrode tooth portion of the source (drain) electrode layer overlapping with the gate electrode layer.

In this specification, functions of a "source" and a "drain" are sometimes interchanged with each other when a transistor of opposite polarity is used or when the direction of current flow is changed in circuit operation, for example. Therefore, the terms "source" and "drain" can be used to denote the drain and the source, respectively, in this specification.

Note that the terms of degrees which are used in this specification, such as "substantially", "about", "slightly", and "approximately", mean a reasonable amount of deviation from the modified term such that the end result is not significantly changed, unless this deviation would negate the meaning of the word it modifies.

With the use of a source (drain) electrode layer in a comb shape extending over a semiconductor layer, the area of a portion where the source (drain) electrode layer and the gate electrode layer overlap each other can be decreased, and parasitic capacitance can thus be reduced. In addition, with a source electrode layer and a drain electrode layer in a comb shape arranged such that comb tooth portions thereof face each other, indirect current can be utilized, and a transistor without a decrease in on-state current can be provided.

BEST MODE FOR CARRYING OUT THE INVENTION

Figure 1A:
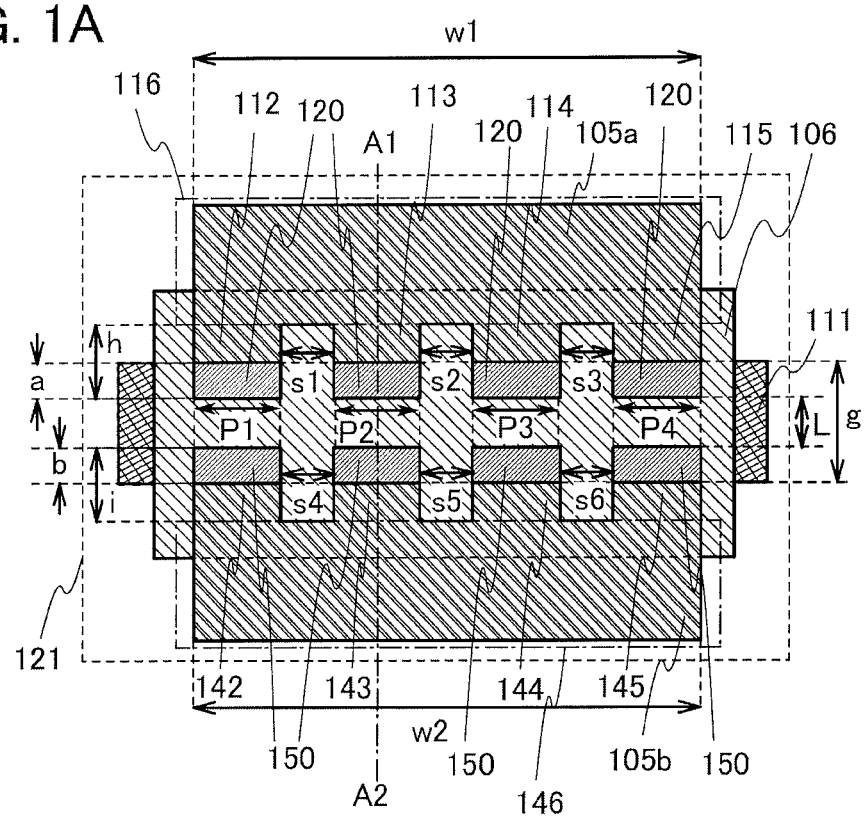
FIGS. 1A and 1B illustrate a transistor of Embodiment 1.

Embodiments will be described in detail with reference to the drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments. Note that the same portions or portions having similar functions are commonly denoted by the same reference numerals in different drawings, and repetitive description thereof is omitted.

Embodiment 1

In this embodiment, embodiments of transistors capable of reducing parasitic capacitance without decreasing on-state current will be described with reference to FIGS. 1A and 1B, FIGS. 2A and 2B, FIGS. 3A and 3B, FIGS. 4A and 4B, FIGS. 5A and 5B, FIGS. 6A and 6B, FIGS. 7A to 7D, and FIGS. 8A and 8B.

A planar structure of a transistor given as an example in this embodiment, which has Structure A including a source electrode layer and a drain electrode layer with a devised shape, is described with reference to FIG. 1A, and a cross-sectional structure thereof is described with reference to FIG. 1B. Note that the cross-sectional view illustrated in FIG. 1B corresponds to a cross-sectional view taken along section line A1-A2 of FIG. 1A. As illustrated in FIG. 1B, a transistor 121 is provided over a substrate 100 and includes a gate electrode layer 111, a gate insulating layer 102 in contact with the gate electrode layer 111, a semiconductor layer 106 overlapping with the gate electrode layer 111 with the gate insulating layer 102 interposed therebetween, a source electrode layer 105a and a drain electrode layer 105b each having an edge in contact with one side of the semiconductor layer 106 and having the edge overlapping with the gate electrode layer 111 with the gate insulating layer 102 interposed therebetween.

Figure 1B:
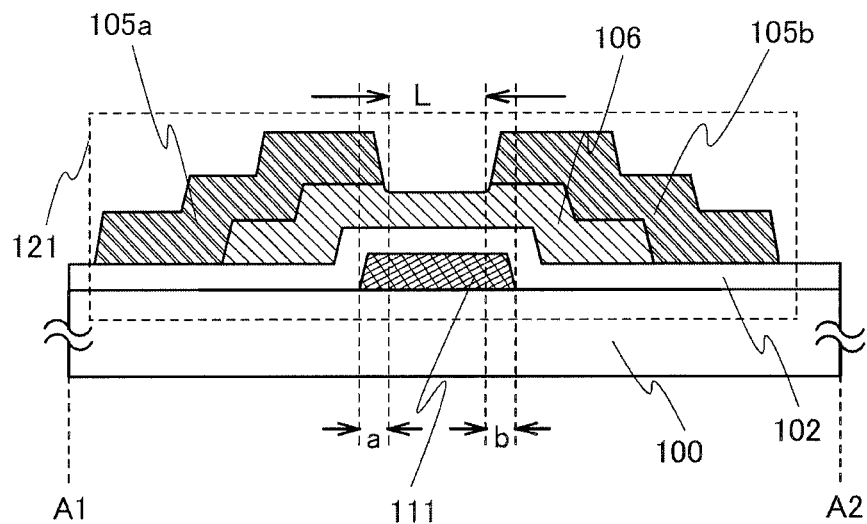

A schematic plan view of the transistor of Structure A is illustrated in FIG. 1A. The source electrode layer 105a includes a plurality of electrode tooth portions 112, 113, 114, and 115 arranged adjacently at predetermined intervals s1, s2, and s3 and a connection portion 116 for connecting the electrode tooth portions.

The drain electrode layer 105b includes a plurality of electrode tooth portions 142, 143, 144, and 145 arranged adjacently at predetermined intervals s4, s5, and s6 and a connection portion 146 for connecting the electrode tooth portions.

The source electrode layer 105a and the drain electrode layer 105b are disposed such that the electrode tooth portions 112, 113, 114, and 115 of the source electrode layer 105a and the electrode tooth portions 142, 143, 144, and 145 of the drain electrode layer 105b face each other without interdigitating with each other.

An end of the electrode tooth portion 112 and an end of the electrode tooth portion 142 are disposed to face each other along the same length (P1). An end of the electrode tooth portion 113 and an end of the electrode tooth portion 143 are disposed to face each other along the same length (P2). An end of the electrode tooth portion 114 and an end of the electrode tooth portion 144 are disposed to face each other along the same length (P3). An end of the electrode tooth portion 115 and an end of the electrode tooth portion 145 are disposed to face each other along the same length (P4).

It is preferable that the interval between the end of the source electrode layer 105a and the end of the drain electrode layer 105b be 3 µm or more, for example. This is in order to prevent a contact between the electrode layers so as not to cause a defect such as a short circuit.

The source electrode layer 105a and the drain electrode layer 105b may each be formed by stacking a plurality of layers.

As illustrated in FIG. 1A, each of the electrode tooth portions 112, 113, 114, and 115 of the source electrode layer 105a and each of the electrode tooth portions 142, 143, 144, and 145 of the drain electrode layer 105b include an overlap portion 120 and an overlap portion 150, respectively, so as to ensure partial overlaps with the gate electrode layer 111 with the semiconductor layer 106 interposed therebetween. Alternatively, the entire area of each of the electrode tooth portions 112, 113, 114, and 115 of the source electrode layer 105a and the entire area of each of the electrode tooth portions 142, 143, 144, and 145 of the drain electrode layer 105b may overlap with the gate electrode layer 111.

The connection portion 116 of the source electrode layer (comb-shaped electrode layer) 105a and the gate electrode layer 111 are disposed so as not to overlap each other, and the connection portion 146 of the drain electrode layer (comb-shaped electrode layer) 105b and the gate electrode layer 111 are disposed so as not to overlap each other.

The length a of the overlap portion 120 between each of the electrode tooth portions 112, 113, 114, and 115 of the source electrode layer 105a and the gate electrode layer 111 in a direction where each of the electrode tooth portions of the source electrode layer 105a extends and the length b of the overlap portion 150 between each of the electrode tooth portions 142, 143, 144, and 145 of the drain electrode layer 105b and the gate electrode layer 111 in a direction where each of the electrode tooth portions of the drain electrode layer 105b extends are each preferably 1.5 µm m or more, for example. This is because, when the gate width g is constant, if the length a of the overlap portion 120 (the length b of the overlap portion 150) is too short, the interval L between the end of the source electrode layer 105a and the end of the drain electrode layer 105b is too long, in which case there is a problem such as a drastic decrease in on-state current, or an increase in electrical resistance of a transistor due to impossibility of establishment of contact in the overlap portion 120 (the overlap portion 150) between the source electrode layer 105a (the drain electrode layer 105b) and the gate electrode layer 111. Note that the length a of the overlap portion 120 between each of the electrode tooth portions of the source electrode layer 105a and the gate electrode layer 111 may be either longer or shorter than the length b of the overlap portion 150 between each of the electrode tooth portions of the drain electrode layer 105b and the gate electrode layer 111.

The upper surface of each of the electrode tooth portions 112, 113, 114, and 115 of the source electrode layer 105a may have at least one rounded corner, and either or both side surfaces thereof may be inclined or curved.

The upper surface of each of the electrode tooth portions 142, 143, 144, and 145 of the drain electrode layer 105b may have at least one rounded corner, and either or both side surfaces thereof may be inclined or curved.

The length h of each of the electrode tooth portions 112, 113, 114, and 115 of the source electrode layer 105a and the length i of each of the electrode tooth portions 142, 143, 144, and 145 of the drain electrode layer 105b may be the same or different.

The interval (s1) between the electrode tooth portions 112 and 113, the interval (s2) between the electrode tooth portions 113 and 114, and the interval (s3) between the electrode tooth portions 114 and 115 of the source electrode layer 105a and the interval (s4) between the electrode tooth portions 142 and 143, the interval (s5) between the electrode tooth portions 143 and 144, and the interval (s6) between the electrode tooth portions 144 and 145 of the drain electrode layer 105b are each preferably greater than 0 µm and less than or equal to 5 µm. In particular, in order to ensure a reduction in parasitic capacitance, the interval s1, the interval s2, the interval s3, the interval s4, the interval s5, and the interval s6 are each preferably greater than 3 µm and less than or equal to 5 µm. Furthermore, in order to keep a decrease in on-state current within the acceptable range, the intervals are each preferably less than or equal to the length of a channel formation region (the interval L between the end of the source electrode layer 105a and the end of the drain electrode layer 105b).

The width of the end of the source electrode layer 105a (comb-shaped electrode layer) is preferably 3/8 to 1/1 of the width w1 of the source electrode layer 105a and 3/8 to 8/3 of the width w2 of the drain electrode layer 105b.

The width of the end of the drain electrode layer 105b (comb-shaped electrode layer) is preferably 3/8 to 1/1 of the width w2 of the drain electrode layer 105b and 3/8 to 8/3 of the width w1 of the source electrode layer 105a.

Figure 2A:
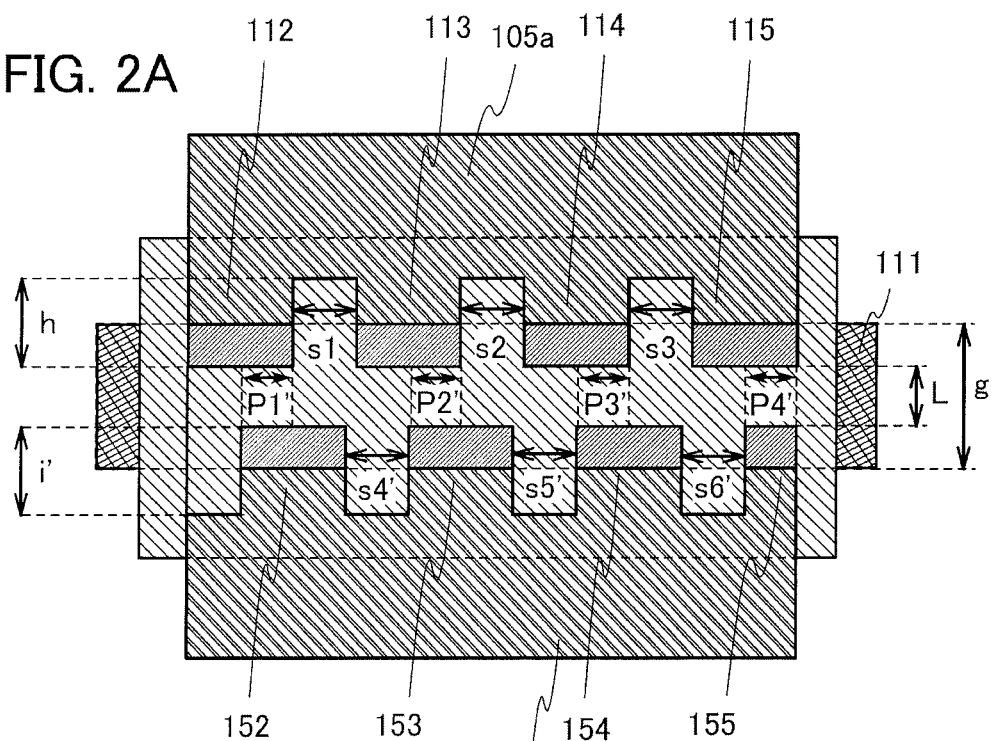
FIGS. 2A and 2B each illustrate a transistor of Embodiment 1.

Note that, as illustrated in FIG. 2A (Structure B), the ends of the electrode tooth portions 112, 113, 114, and 115 and ends of electrode tooth portions 152, 153, 154, and 155 may be disposed to face each other along lengths (P1', P2', P3', and P4') different from the lengths of the end of the electrode tooth portions 112, 113, 114, and 115 or the electrode tooth portions 152, 153, 154, and 155, respectively (i.e., misaligned with each other).

In that case, the interval (s1) between the electrode tooth portions 112 and 113, the interval (s2) between the electrode tooth portions 113 and 114, and the interval (s3) between the electrode tooth portions 114 and 115 of the source electrode layer 105a and the interval (s4') between the electrode tooth portions 152 and 153, the interval (s5') between the electrode tooth portions 153 and 154, and the interval (s6') between the electrode tooth portions 154 and 155 of a drain electrode layer 106b may be the same or different. The length h of each of the electrode tooth portions 112, 113, 114, and 115 of the source electrode layer 105a and the length i' of each of the electrode tooth portions 152, 153, 154, and 155 of the drain electrode layer 106b may be the same or different.

Figure 2B:
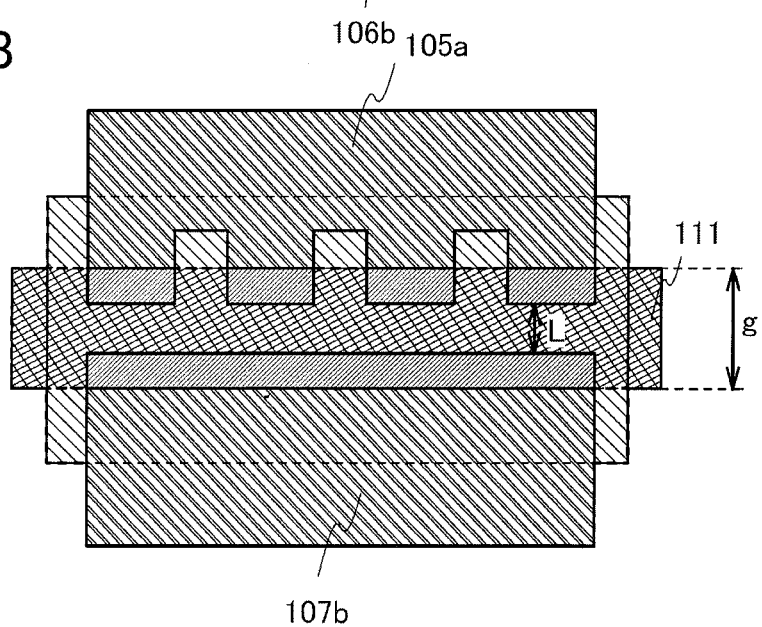

Note that, as illustrated in FIG. 2B (Structure C), a drain electrode layer 107b in a rectangular shape may be employed.

Next, it is explained that, with a transistor where a source electrode layer and a drain electrode layer have a devised novel shape, on-state current can be substantially maintained while parasitic capacitance generated in an overlap portion between the source electrode layer (the drain electrode layer) and a gate electrode layer is decreased, in comparison to a conventional transistor.

Figure 3A:
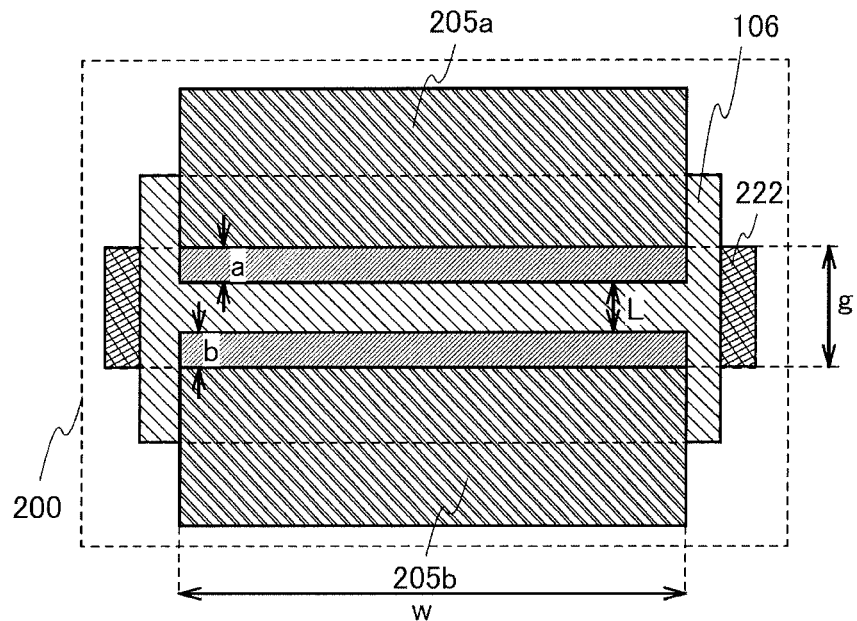
FIGS. 3A and 3B each illustrate a transistor of Embodiment 1.
Figure 3B:
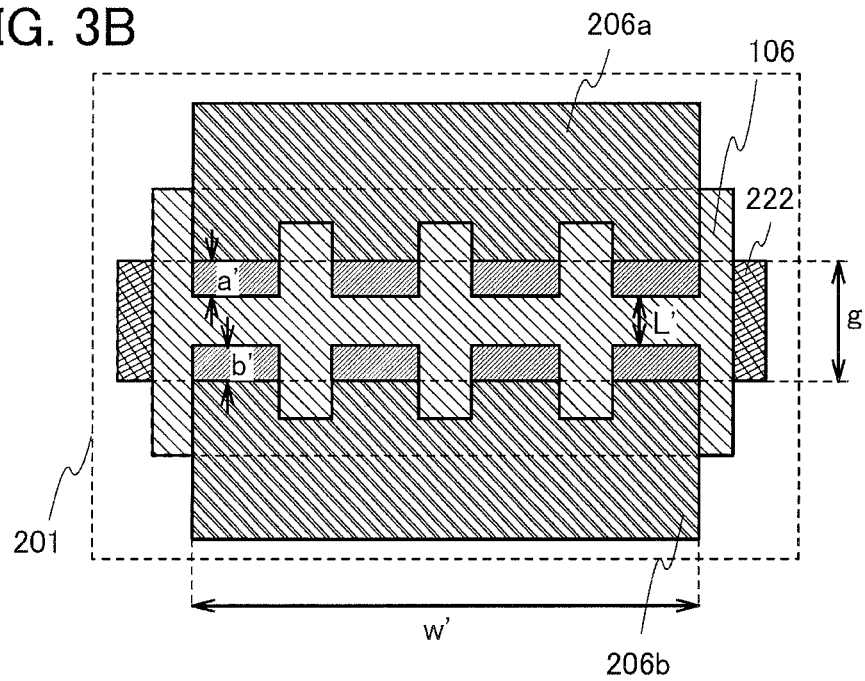

An example of a schematic plan view of a conventional transistor 200 is illustrated in FIG. 3A, and an example of a schematic plan view of a transistor 201 having a novel electrode shape (Structure A) is illustrated in FIG. 3B. Note that cross-sectional structures of the transistors 200 and 201 are identical to the cross-sectional structure of the transistor 121 of Structure A in FIG. 1B.

FIG. 3A illustrates a source electrode layer 205a, a drain electrode layer 205b, a gate electrode layer 222, and a semiconductor layer 106. FIG. 3B illustrates a source electrode layer 206a, a drain electrode layer 206b, a gate electrode layer 222, and a semiconductor layer 106.

Note that the width w of the source electrode layer 205a (the drain electrode layer 205b) and the width w' of the source electrode layer 206a (the drain electrode layer 206b) are the same. The length a of an overlap portion between the source electrode layer 205a and the gate electrode layer 222, the length b of an overlap portion between the drain electrode layer 205b and the gate electrode layer 222, the length a' of an overlap portion between each of electrode tooth portions of the source electrode layer (comb-shaped electrode layer) 206a and the gate electrode layer 222, and the length b' of an overlap portion between each of electrode tooth portions of the drain electrode layer (comb-shaped electrode layer) 206b and the gate electrode layer 222 are the same. The interval L between an edge of the source electrode layer 205a and an edge of the drain electrode layer 205b and the interval L' between an end of the source electrode layer 206a and an end of the drain electrode layer 206b are the same.

As illustrated in FIGS. 3A and 3B, the area of the overlap portions between the source electrode layer 206a (the drain electrode layer 206b) and the gate electrode layer 222 of the transistor 201 is smaller than the area of the overlap portion between the source electrode layer 205a (the drain electrode layer 205b) and the gate electrode layer 222 of the transistor 200.

For example, when the lengths of the electrode tooth portions of the source electrode layer 206a (the drain electrode layer 206b) illustrated in FIG. 3B are all the same, the widths of the electrode tooth portions of the source electrode layer 206a (the drain electrode layer 206b) are all the same, and the intervals between the electrode tooth portions are all the same, the area of the overlap portions between the source electrode layer 206a (the drain electrode layer 206b) and the gate electrode layer 222 can be about half of the area of the overlap portion between the source electrode layer 205a (the drain electrode layer 205b) and the gate electrode layer 222 illustrated in FIG. 3A.

Therefore, by using a source (drain) electrode layer in a comb shape instead of a rectangular shape, parasitic capacitance generated in an overlap portion can be decreased.

Figure 4A:
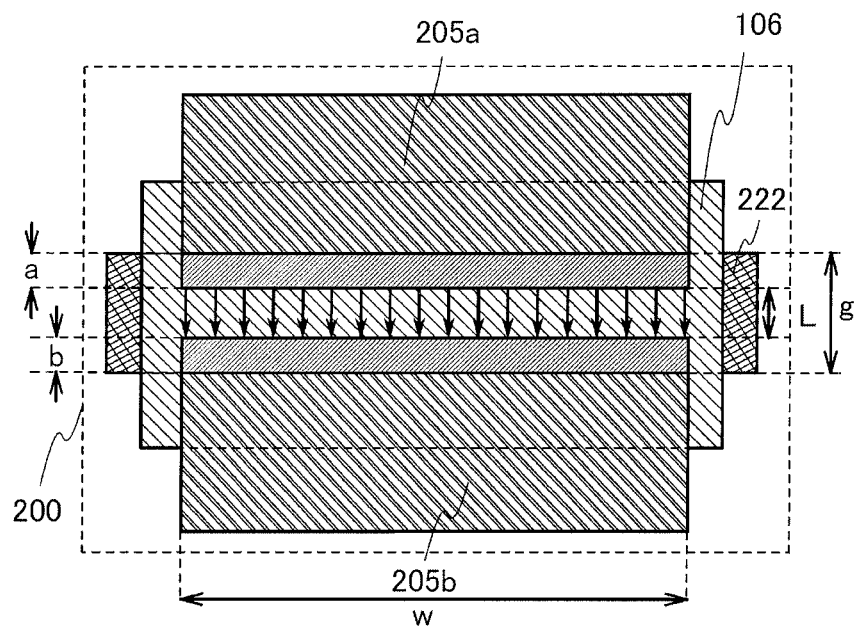
FIGS. 4A and 4B each illustrate a current path in a transistor of Embodiment 1.
Figure 4B:
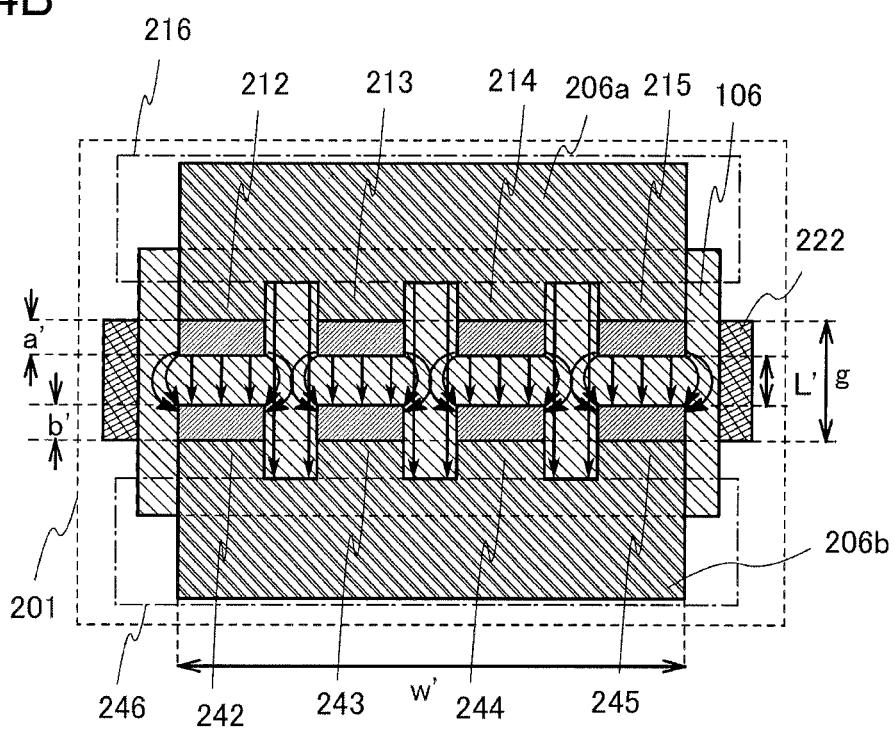

An example of a schematic plan view showing a current path in the transistor 200 is illustrated in FIG. 4A, and an example of a schematic plan view showing a current path in the transistor 201 (Structure A) is illustrated in FIG. 4B.

In the transistor 200, as illustrated in FIG. 4A, linear current flows from the edge of the source electrode layer 205a to the edge of the drain electrode layer 205b. On the other hand, in the transistor 201, as illustrated in FIG. 4B, linear current flows from ends of electrode tooth portions 212, 213, 214, and 215 of the source electrode layer 206a to ends of electrode tooth portions 242, 243, 244, and 245 of the drain electrode layer 206b, and in addition, linear current flows from an edge of a connection portion 216 of the source electrode layer 206a to an edge of a connection portion 246 of the drain electrode layer 206b. The amount of linear current in the transistor 201 is smaller than the amount of linear current in the transistor 200. This is because the connection portion 216 (the connection portion 246) and the gate electrode layer 222 do not overlap each other, which results in an increase in electrical resistance and a decrease in linear current flowing from the edge of the connection portion 216 to the edge of the connection portion 246.

However, in the transistor 201, as illustrated in FIG. 4B, curved current flows from side edges of the electrode tooth portions 212, 213, 214, and 215 of the source electrode layer 206a to side edges of the electrode tooth portions 242, 243, 244, and 245 of the drain electrode layer 206b so as to compensate for a smaller linear current than in the transistor 200.

Accordingly, the amount of linear current in the transistor 200 and the sum of the amounts of linear current and curved current in the transistor 201 can be made substantially equal.

In the transistor 200 illustrated in FIG. 4A, when the gate width g is constant, the area of the overlap portion can be decreased by decreasing the length a of the overlap portion between the source electrode layer 205a and the gate electrode layer 222 (the length b of the overlap portion between the drain electrode layer 205b and the gate electrode layer 222). However, in that case, the length L of a channel formation region (the interval L between the edge of the source electrode layer 205a and the edge of the drain electrode layer 205b) is increased, and thus, on-state current cannot be maintained.

In contrast, by changing the shape of each electrode layer from the source electrode layer 205a (the drain electrode layer 205b) in a rectangular shape to the source electrode layer 206a (the drain electrode layer 206b) in a comb shape, the area of the overlap portion can be decreased without changing the length of the channel formation region (which means that the interval L between the edge of the source electrode layer 205a and the edge of the drain electrode layer 205b and the interval L' between the end of the source electrode layer 206a and the end of the drain electrode layer 206b are equal). Furthermore, in that case, curved current which flows from the side edges of the electrode tooth portions of the source electrode layer 206a to the side edges of the electrode tooth portions of the drain electrode layer 206b so as to surround the electrode tooth portions can be generated. Thus, even when the width of a channel formation region is decreased, on-state current can be kept unchanged. In other words, in the transistor 201, as in the transistor 200, on-state current which depends only on the length of the channel formation region can be maintained.

Therefore, by using a source (drain) electrode layer in a comb shape instead of a rectangular shape, on-state current can be substantially maintained while parasitic capacitance is reduced.

Note that if the intervals between the electrode tooth portions and the interval between the ends of the comb-shaped electrode layers in the transistor 201 illustrated in FIG. 3B and FIG. 4B are further increased, the amount of parasitic capacitance can be reduced. However, it becomes impossible to generate curved current flowing so as to surround the electrode tooth portions, in an amount sufficient to compensate for a decrease in linear current. In that case, on-state current is drastically decreased. Therefore, the intervals between the electrode tooth portions and the interval between the ends of the comb-shaped electrode layers should be set at a certain value or less in order to obtain a certain amount of on-state current or more.

With such a structure as described above, it is possible to provide a transistor having a novel structure capable of substantially maintaining on-state current while reducing parasitic capacitance generated in an overlap portion between a source electrode layer (a drain electrode layer) and a gate electrode layer.

Note that each of the structures described in this embodiment can be combined with any structure described as an example in the other embodiments as appropriate.

Embodiment 2

In this embodiment, a manufacturing process in the case of using an oxide semiconductor as a material of the semiconductor layer included in the transistor described in Embodiment 1 will be described with reference to FIGS. 9A to 9E.

The same portion as or a portion having a function similar to that in the above embodiment can be formed as in the above embodiment, and the same step as or a step similar to that in the above embodiment can be performed as in the above embodiment, and thus, repetitive description is omitted. In addition, detailed description of the same portions is not repeated.

A process of manufacturing a transistor 510 over a substrate 505 will be described below with reference to FIGS. 9A to 9E.

First, a conductive film is formed over the substrate 505 having an insulating surface, and then, a gate electrode layer 511 is formed in a first photolithography step. Note that a resist mask may be formed by an inkjet method. Formation of the resist mask by an inkjet method requires no photomask; thus, manufacturing cost can be reduced.

In this embodiment, a glass substrate is used as the substrate 505 having an insulating surface.

An insulating film which serves as a base film may be provided between the substrate 505 and the gate electrode layer 511. The base film has the function of preventing diffusion of an impurity element from the substrate 505, and can be formed with a single-layer structure or a stacked-layer structure using one or more of a silicon nitride film, a silicon oxide film, a silicon nitride oxide film, and a silicon oxynitride film.

The gate electrode layer 511 can be formed to have a single-layer or stacked-layer structure using a metal material such as molybdenum, titanium, tantalum, tungsten, aluminum, copper, neodymium, or scandium or an alloy material which contains any of these materials as its main component.

Next, a gate insulating layer 507 is formed over the gate electrode layer 511. The gate insulating layer 507 can be formed to have a single-layer structure or a stacked-layer structure using one or more of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma, CVD method, a sputtering method, or the like.

For the oxide semiconductor in this embodiment, an i-type semiconductor or a substantially i-type semiconductor obtained by removing an impurity therefrom is used. Such a purified oxide semiconductor is highly sensitive to an interface state and interface charge; thus, the interface between the oxide semiconductor layer and the gate insulating layer is important. Therefore, the gate insulating layer that is to be in contact with the purified oxide semiconductor needs to have high quality.

For example, a high-quality insulating layer which is dense and has high withstand voltage can be formed by a high density plasma CVD method using microwaves (e.g., with a frequency of 2.45 GHz), which is preferable. This is because when the purified oxide semiconductor and the high-quality gate insulating layer are disposed in close contact with each other, interface states can be reduced and interface characteristics can be made favorable.

Needless to say, other film formation methods, such as a sputtering method or a plasma CVD method, can be employed as long as a high-quality insulating layer can be formed as the gate insulating layer. A gate insulating layer whose film quality is improved, or an insulating layer whose characteristics of an interface with the oxide semiconductor are improved, by heat treatment after the formation may be used. In any case, any insulating layer that has a reduced interface state density and can form a favorable interface with the oxide semiconductor as well as having favorable film quality as a gate insulating layer can be used.

In order to prevent the gate insulating layer 507 and an oxide semiconductor film 530 from containing hydrogen, a hydroxyl group, and moisture as much as possible, it is preferable to preheat the substrate 505 provided with the gate electrode layer 511 or the substrate 505 provided with the gate electrode layer 511 and the gate insulating layer 507 in a preheating chamber of a sputtering apparatus before formation of the oxide semiconductor film 530 so that an impurity such as hydrogen or moisture adsorbed on the substrate 505 is eliminated, and then perform evacuation. As an evacuation unit provided in the preheating chamber, a cryopump is preferable. This preheating step is not necessarily performed. This preheating step may be performed in a similar manner on the substrate 505 provided with components up to and including a source electrode layer 515a and a drain electrode layer 515b before an insulating layer 516 is formed.

Figure 9A:
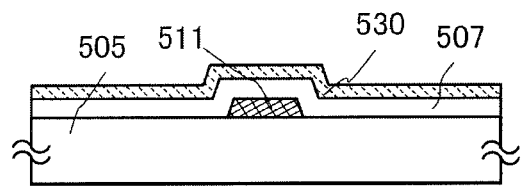
FIGS. 9A to 9E illustrate a transistor of Embodiment 2.
Figure 9B:
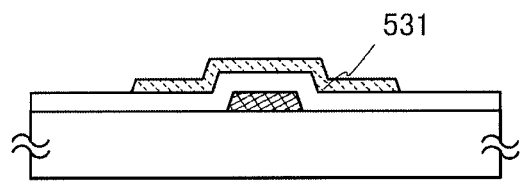

Next, the oxide semiconductor film 530 having a thickness of 2 nm to 200 nm, preferably 5 nm to 30 nm, is formed over the gate insulating layer 507 (see FIG. 9A).

Note that before the oxide semiconductor film 530 is formed by a sputtering method, it is preferable to perform reverse sputtering in which an argon gas is introduced and plasma is generated so that powder substances (also referred to as particles or dust) on a surface of the gate insulating layer 507 is removed. The reverse sputtering refers to a method in which, without application of voltage to a target side, an RF power source is used for application of voltage to a substrate side in an argon atmosphere to generate plasma in the vicinity of the substrate and modify a surface. Note that an atmosphere of nitrogen, helium, oxygen, or the like may be used instead of an argon atmosphere.

The oxide semiconductor film 530 can be formed using a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor, a single-component oxide semiconductor such as an In—O-based oxide semiconductor, a Sn—O-based oxide semiconductor, or a Zn—O-based oxide semiconductor, or the like. In addition, the oxide semiconductor may include $SiO_2$. For example, an In—Ga—Zn—O-based oxide semiconductor means an oxide containing indium (In), gallium (Ga), and zinc (Zn), and there is no limitation on the stoichiometric proportion thereof. In addition, the oxide semiconductor may contain an element other than In, Ga, and Zn. In this embodiment, the oxide semiconductor film 530 is formed by a sputtering method using an In—Ga—Zn—O-based metal oxide target. A cross-sectional view at this stage is FIG. 9A.

As the target for forming the oxide semiconductor film 530 by a sputtering method, for example, an oxide target having a composition ratio of $In_2O_3:Ga_2O_3:ZnO=1:1:1$ [molar ratio] is used to form an In—Ga—Zn—O film. Without limitation to the material and the composition of the above target, for example, an oxide target having a composition ratio of $In_2O_3:Ga_2O_3:ZnO=1:1:2$ [molar ratio] may be used.

Furthermore, the filling rate of the oxide target is 90% to 100%, preferably 95% to 99.9%. The oxide semiconductor film is dense when formed using a metal oxide target with high filling rate.

As a sputtering gas used in formation of the oxide semiconductor film 530, a high-purity gas in which an impurity such as hydrogen, water, a hydroxyl group, or hydride is reduced is preferably used.

The substrate is held in a deposition chamber kept under reduced pressure, and the substrate temperature is set in the range from 100° C. to 600° C., preferably 200° C. to 400° C. By heating the substrate during the film formation, the concentration of an impurity contained in the oxide semiconductor film can be decreased. Moreover, damage due to sputtering is reduced. Then, a sputtering gas in which hydrogen and water are reduced is introduced into the deposition chamber from which remaining moisture is removed, and the oxide semiconductor film 530 is formed over the substrate 505 using the above target. In order to remove moisture remaining in the deposition chamber, an entrapment vacuum pump such as a cryopump, an ion pump, or a titanium sublimation pump is preferably used. The evacuation unit may be a turbo pump provided with a cold trap. From the deposition chamber evacuated with a cryopump, a hydrogen atom, a compound including a hydrogen atom such as water ($H_2O$) (preferably, also a compound including a carbon atom), or the like, for example, is removed; thus, the concentration of an impurity in the oxide semiconductor film formed in the deposition chamber can be reduced.

The atmosphere for a sputtering method may be a rare gas (typically, argon) atmosphere, an oxygen atmosphere, or a mixed atmosphere containing a rare gas and oxygen.

As an example of the film formation conditions, the following conditions are employed: the distance between the substrate and the target is 100 mm; the pressure is 0.6 Pa; the direct current (DC) power is 0.5 kW; and the atmosphere is oxygen (the proportion of oxygen flow is 100%). Note that a pulsed direct current power source is preferable because powder substances (also referred to as particles or dust) generated in film formation can be reduced and the film thickness can be made uniform.

Next, the oxide semiconductor film 530 is processed into an oxide semiconductor layer having an island shape in a second photolithography step. A resist mask for forming the oxide semiconductor layer having an island shape may be formed by an inkjet method. Formation of the resist mask by an inkjet method requires no photomask; thus, manufacturing cost can be reduced.

In the case where a contact hole is formed in the gate insulating layer 507, a step thereof can be performed at the time of the processing of the oxide semiconductor film 530.

Note that the etching of the oxide semiconductor film 530 may be dry etching, wet etching, or both dry etching and wet etching. An example of an etchant which can be used for wet etching of the oxide semiconductor film 530 includes a mixed solution of phosphoric acid, acetic acid, and nitric acid or the like. An etchant such as ITO-07N (produced by KANTO CHEMICAL CO., INC.) may also be used.

Next, first heat treatment is performed on the oxide semiconductor layer. The oxide semiconductor layer can be dehydrated or dehydrogenated by the first heat treatment. The first heat treatment is performed at a temperature higher than or equal to 400° C. and lower than or equal to 750° C., or higher than or equal to 400° C. and lower than a strain point of the substrate. Here, the substrate is introduced into an electric furnace which is one of heat treatment apparatuses, and the heat treatment of the oxide semiconductor layer is performed in a nitrogen atmosphere at 450° C. for 1 hour. After that, the oxide semiconductor layer is prevented from being exposed to the air, which prevents water or hydrogen from re-entering the oxide semiconductor layer. Thus, an oxide semiconductor layer 531 is obtained (see FIG. 9B).

The heat treatment apparatus is not limited to an electric furnace and may be an apparatus that heats an object to be processed by thermal conduction or thermal radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for performing heat treatment using a high-temperature gas. As the high-temperature gas, an inert gas which does not react by heat treatment with the object to be processed, like nitrogen or a rare gas such as argon, is used.

For example, as the first heat treatment, GRTA may be performed as follows: the substrate is transferred into an inert gas heated to a high temperature of 650° C. to 700° C., heated for several minutes, and transferred and taken out of the inert gas heated to the high temperature.

In the first heat treatment, it is preferable that water, hydrogen, or the like be not contained in nitrogen or a rare gas such as helium, neon, or argon. Alternatively, the purity of nitrogen or a rare gas such as helium, neon, or argon introduced into a heat treatment apparatus is preferably set to 6N (99.9999%) or more, more preferably 7N (99.99999%) or more (i.e., the impurity concentration is 1 ppm or less, preferably 0.1 ppm or less).

After the oxide semiconductor layer is heated by the first heat treatment, a high-purity oxygen gas, a high-purity $N_2O$ gas, or ultra-dry air (having a dew point of −40° C. or lower, preferably −60° C. or lower) may be introduced into the same furnace. It is preferable that the oxygen gas or the $N_2O$ gas do not contain water, hydrogen, or the like. Alternatively, the purity of an oxygen gas or an $N_2O$ gas which is introduced into the heat treatment apparatus is preferably 6N or higher, more preferably 7N or higher (that is, the concentration of impurities in the oxygen gas or the $N_2O$ gas is 1 ppm or less, preferably 0.1 ppm or less). By the effect of the oxygen gas or the $N_2O$ gas, oxygen which is one of main components of the oxide semiconductor and which has been reduced at the same time as the step for removing impurities by dehydration or dehydrogenation is supplied, so that the oxide semiconductor layer can be purified to be electrically i-type (intrinsic).

The first heat treatment of the oxide semiconductor layer can also be performed on the oxide semiconductor film 530 before being processed into the oxide semiconductor layer having an island shape. In that case, the substrate is taken out from the heating apparatus after the first heat treatment, and then a photolithography step is performed.

Note that other than the above timing, the first heat treatment may be performed at any of the following timings as long as it is after the oxide semiconductor layer is formed. For example, the timing may be after a source electrode layer and a drain electrode layer are formed over the oxide semiconductor layer or after an insulating layer is formed over the source electrode layer and the drain electrode layer.

Further, in the case where a contact hole is formed in the gate insulating layer 507, the formation of the contact hole may be performed before or after the first heat treatment is performed on the oxide semiconductor film 530.

Alternatively, the oxide semiconductor layer may be formed through two deposition steps and two heat treatment steps. The thus formed oxide semiconductor layer has a thick crystalline region (single-crystal region), that is, a crystalline region the c-axis of which is aligned in a direction perpendicular to a surface of the layer, regardless of whether the material of a base component is an oxide, a nitride, a metal, or the like. For example, a first oxide semiconductor film with a thickness greater than or equal to 3 nm and less than or equal to 15 nm is deposited, and first heat treatment is performed in a nitrogen, oxygen, rare gas, or dry air atmosphere at 450° C. to 850° C., preferably 550° C. to 750° C., so that the first oxide semiconductor film has a crystalline region (including a plate-like crystal) in a region including its surface. Then, a second oxide semiconductor film which has a larger thickness than the first oxide semiconductor film is formed, and second heat treatment is performed at 450° C. to 850° C., preferably 600° C. to 700° C., so that crystal growth proceeds upward with use of the first oxide semiconductor film as a seed of the crystal growth and the whole second oxide semiconductor film is crystallized. In such a manner, the oxide semiconductor layer having a thick crystalline region may be obtained.

Next, a conductive film to be the source and drain electrode layers (including a wiring formed using the same layer as the source and drain electrode layers) is formed over the gate insulating layer 507 and the oxide semiconductor layer 531. As a conductive film used for the source electrode layer and the drain electrode layer, for example, a metal film containing an element selected from Al, Cr, Cu, Ta, Ti, Mo, and W or a metal nitride film containing any of the above elements as its main component (a titanium nitride film, a molybdenum nitride film, or a tungsten nitride film) can be used. A high-melting-point metal film of Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like. In particular, it is preferable to provide a conductive film containing titanium on the side in contact with the oxide semiconductor layer.

Figure 9C:
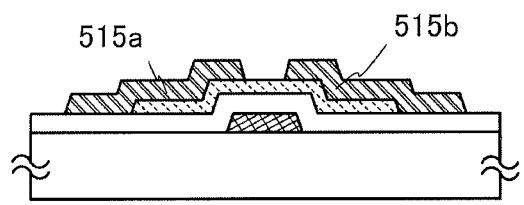

A resist mask is formed over the conductive film by a third photolithography step, and the source electrode layer 515a and the drain electrode layer 515b are formed by selective etching, and then, the resist mask is removed (see FIG. 9C).

Note that the source electrode layer 515a and the drain electrode layer 515b have a comb shape, and at least part of each of electrode tooth portions extending over the oxide semiconductor layer 531 overlaps with the gate electrode layer 511.

By using the source electrode layer 515a and the drain electrode layer 515b in a comb shape, the area of a portion where the source electrode layer 515a (the drain electrode layer 515b) and the gate electrode layer 511 overlap each other can be decreased, and parasitic capacitance can thus be reduced.

In addition, when the source electrode layer 515a and the drain electrode layer 515b in a comb shape are disposed such that the electrode tooth portions thereof face each other as illustrated in FIG. 9C, curved current which flows from side edges of the electrode tooth portions of the source electrode layer 515a to side edges of the electrode tooth portions of the drain electrode layer 515b so as to surround the electrode tooth portions can be generated. By utilizing this curved current (indirect current), a decrease in on-state current can be prevented.

Light exposure at the time of the formation of the resist mask in the third photolithography step may be performed using ultraviolet light, KrF laser light, or ArF laser light. The channel length L of a transistor to be formed is determined by the distance between a lower edge of the source electrode layer and a lower edge of the drain electrode layer, which are adjacent to each other over the oxide semiconductor layer 531. In the case where light exposure is performed for a channel length L of less than 25 nm, the light exposure at the time of the formation of the resist mask in the third photolithography step is performed using extreme ultraviolet light having an extremely short wavelength of several nanometers to several tens of nanometers. The resolution of light exposure with extreme ultraviolet rays is high and the depth of focus is large. Accordingly, the channel length L of the transistor can be made to be 10 nm to 1000 nm, and the operation speed of a circuit can be increased.

Note that it is preferable that etching conditions be optimized so as not to etch and divide the oxide semiconductor layer 531 when the conductive film is etched. However, it is difficult to obtain conditions under which only the conductive film is etched and the oxide semiconductor layer 531 is not etched at all. Therefore, in some cases, only part of the oxide semiconductor layer 531 is etched to be an oxide semiconductor layer having a groove (a depressed portion) at the time of etching of the conductive film.

In this embodiment, a Ti film is used as the conductive film and the In—Ga—Zn—O-based oxide semiconductor is used for the oxide semiconductor layer 531; thus, an ammonium hydrogen peroxide mixture (31 wt. % hydrogen peroxide water: 28 wt. % ammonia water:water=5:2:2) is used as an etchant of the Ti film.

Next, plasma treatment using a gas such as $N_2O$, $N_2$, or Ar may be performed to remove water or the like adsorbed on a surface of the oxide semiconductor layer which is exposed. In the case where the plasma treatment is performed, the insulating layer 516 is formed without exposure to the air, as a protective insulating layer which is in contact with part of the oxide semiconductor layer.

The insulating layer 516 can be formed to a thickness of at least 1 nm by a method by which an impurity such as water or hydrogen does not enter the insulating layer 516, such as a sputtering method, as appropriate. When hydrogen is contained in the insulating layer 516, entry of the hydrogen to the oxide semiconductor layer, or extraction of oxygen from the oxide semiconductor layer by hydrogen may occur, in which case the backchannel of the oxide semiconductor layer may have lower resistance (become n-type), so that a parasitic channel may be formed. Therefore, it is important that a formation method in which hydrogen is not used be employed so that the insulating layer 516 contains hydrogen as little as possible.

In this embodiment, a silicon oxide film is formed to a thickness of 200 nm as the insulating layer 516 by a sputtering method. The substrate temperature during film formation may be higher than or equal to room temperature and lower than or equal to 300° C., and is 100° C. in this embodiment. The silicon oxide film can be formed by a sputtering method in a rare gas (typically, argon) atmosphere, an oxygen atmosphere, or a mixed atmosphere of a rare gas and oxygen. As a target, a silicon oxide target or a silicon target may be used. For example, the silicon oxide film can be formed using a silicon target by a sputtering method in an atmosphere containing oxygen. As the insulating layer 516 which is formed in contact with the oxide semiconductor layer, an inorganic insulating film which does not contain impurities such as moisture, a hydrogen ion, and $OH^-$ and blocks the entry of these impurities from the outside is used. Typically, a silicon oxide film, a silicon oxynitride film, an aluminum oxide film, an aluminum oxynitride film, or the like is used.

As in the case of forming the oxide semiconductor film 530, an entrapment vacuum pump (e.g., a cryopump) is preferably used in order to remove moisture remaining in a deposition chamber used for forming the insulating layer 516. When the insulating layer 516 is formed in the deposition chamber evacuated using a cryopump, the concentration of impurities in the insulating layer 516 can be reduced. A turbo pump provided with a cold trap may be used as an evacuation unit for removing moisture remaining in the deposition chamber used for forming the insulating layer 516.

As a sputtering gas used in formation of the insulating layer 516, a high-purity gas in which an impurity such as hydrogen, water, a hydroxyl group, or hydride is reduced is preferably used.

Next, second heat treatment is performed in an inert gas atmosphere or an oxygen gas atmosphere (preferably, at 200° C. to 400° C., for example, 250° C. to 350° C.). For example, the second heat treatment is performed in a nitrogen atmosphere at 250° C. for 1 hour. In the second heat treatment, part of the oxide semiconductor layer (a channel formation region) is heated while being in contact with the insulating layer 516.

Through the above process, the first heat treatment is performed on the oxide semiconductor film so that an impurity such as hydrogen, moisture, a hydroxyl group, or hydride (also referred to as a hydrogen compound) is intentionally removed from the oxide semiconductor layer. Additionally, oxygen which is one of main components of the oxide semiconductor and is reduced at the same time as the step for removing an impurity can be supplied. Accordingly, the oxide semiconductor layer is purified to be an electrically i-type (intrinsic) semiconductor.

Figure 9D:
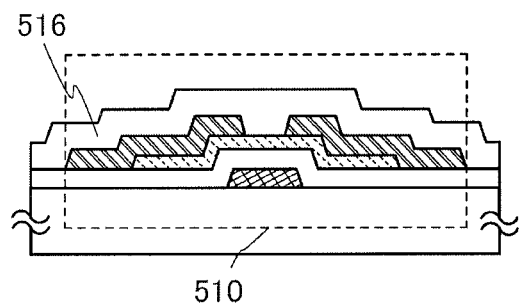
Figure 9E:
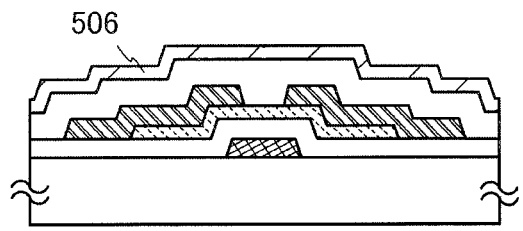

Through the above process, the transistor 510 is formed (FIG. 9D).

When a silicon oxide layer having many defects is used as the insulating layer 516, heat treatment after formation of the silicon oxide layer has an effect in diffusing an impurity such as hydrogen, moisture, a hydroxyl group, or hydride contained in the oxide semiconductor layer to the oxide insulating layer so that the impurity contained in the oxide semiconductor layer can be further reduced.

A protective insulating layer 506 may be additionally formed over the insulating layer 516. As the protective insulating layer 506, for example, a silicon nitride film is formed by an RF sputtering method. The RF sputtering method is preferably used for forming the protective insulating layer because high productivity is achieved. The protective insulating layer is formed using an inorganic insulating film which does not include impurities such as moisture and blocks entry of these impurities from the outside; for example, a silicon nitride film, an aluminum nitride film, or the like is used. In this embodiment, the protective insulating layer 506 is formed using a silicon nitride film (see FIG. 9E).

In this embodiment, as the protective insulating layer 506, a silicon nitride film is formed by introducing a sputtering gas containing high-purity nitrogen in which hydrogen and moisture are reduced and by using a silicon semiconductor target, while heating the substrate 505, which is provided with components to and including the insulating layer 516, to a temperature of 100° C. to 400° C. In that case, it is also preferable that residual moisture be removed from the treatment chamber during formation of the protective insulating layer 506 as in the case of the insulating layer 516.

After the formation of the protective insulating layer, heat treatment may be performed in the air at a temperature of 100° C. to 200° C. for 1 hour to 30 hours. This heat treatment may be performed at a fixed heating temperature. Alternatively, the following change in the heating temperature may be conducted plural times repeatedly: the heating temperature is raised from room temperature to a temperature of 100° C. to 200° C. and then lowered to room temperature.

With the use of an oxide semiconductor in the transistor described as an example in this embodiment, high field-effect mobility can be obtained, and thus, high-speed operation can be achieved. In addition, because the source electrode layer 515a (the drain electrode layer 515b) has a comb shape, parasitic capacitance generated between the source electrode layer 515a (the drain electrode layer 515b) and the gate electrode layer 511 can be reduced, and at the same time, high-speed operation can be achieved. Furthermore, distortion of a signal applied to the gate electrode layer 511 is negligible, and a transistor circuit including an oxide semiconductor can be operated at a high frequency.

Various devices including such a transistor can operate with less power consumption and at higher speed. It can be said that this expands the possibility for a built-in driver in a larger panel or in a more high-definition panel of a liquid crystal display device, for example.

Note that each of the structures described in this embodiment can be combined with any structure described as an example in the other embodiments as appropriate.

The above-described structures will be described below in more detail as an example of the present invention.

Example 1

In this example, transistors each including a source electrode layer and a drain electrode layer having a devised shape as described in Embodiment 1 as an example were manufactured. It will be specifically verified by experiment that the manufactured transistors can substantially maintain on-state current even when parasitic capacitance generated in the overlap portion between the source electrode layer (the drain electrode layer) and the gate electrode layer is reduced.

The details of a cross-sectional structure of each transistor in this example are as follows. A base film was formed over a glass substrate. The base film was formed by stacking two layers which were a silicon nitride film with a thickness of 100 nm and a silicon oxynitride film with a thickness of 150 nm. A gate electrode layer was formed over the base film. The gate electrode layer was formed using tungsten (W) to a thickness of 100 nm. Then, a gate insulating film was formed over the gate electrode layer. The gate insulating film was formed using a silicon oxynitride film with a thickness of 100 nm. Furthermore, an oxide semiconductor film was formed so as to overlap with the gate electrode layer with the gate insulating film interposed therebetween. The oxide semiconductor film was formed using IGZO to a thickness of 15 nm. Moreover, a source electrode layer and a drain electrode layer were formed such that edges thereof were in contact with the oxide semiconductor film and overlap with the gate electrode layer. The source electrode layer and the drain electrode layer were formed by stacking three layers of titanium (Ti), aluminum (Al), and titanium (Ti) with thicknesses of 50 nm, 200 nm, and 50 nm, respectively.

Figure 5A:
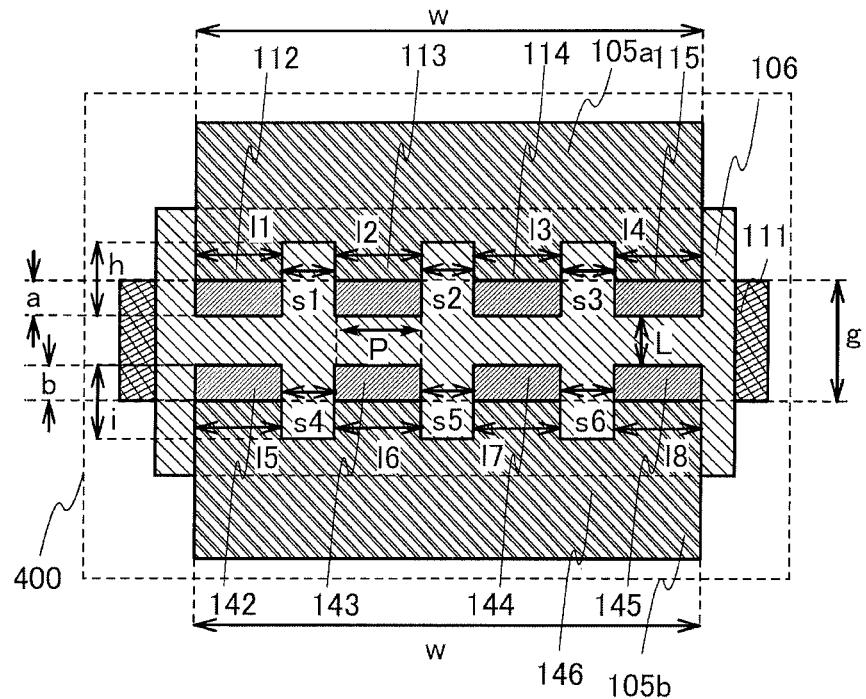
FIGS. 5A and 5B each illustrate a transistor of Example 1.

The details of planar structures of transistors in this example are shown in FIGS. 5A and 5B and FIGS. 6A and 6B. Four types of transistors including source electrode layers and drain electrode layers having different shapes were manufactured. A transistor 400 of Structure A was formed as illustrated in FIG. 5A. Specifically, the interval L between an end of a source electrode layer 105a (comb-shaped electrode layer) and an end of a drain electrode layer 105b (comb-shaped electrode layer) was 3 µm. The width w of the source electrode layer 105a (the width w of the drain electrode layer 105b) was 50 µm. Each of the widths l1, l2, l3, l4, l5, l6, l7, and l8 of electrode tooth portions was 3 µm. Each of the intervals s1, s2, s3, s4, s5, and s6 between the electrode tooth portions was 3 µm. The length h (i) of each of the electrode tooth portions of the source electrode layer 105a (the drain electrode layer 105b) was 2 µm. The length a (b) of an overlap portion between each of the electrode tooth portions of the source electrode layer 105a (the drain electrode layer 105b) and a gate electrode layer 111 was 1.5 µm. The gate width g was 6 µm. The length P along which the ends of the electrode tooth portions face each other was 3 µm.

Figure 5B:
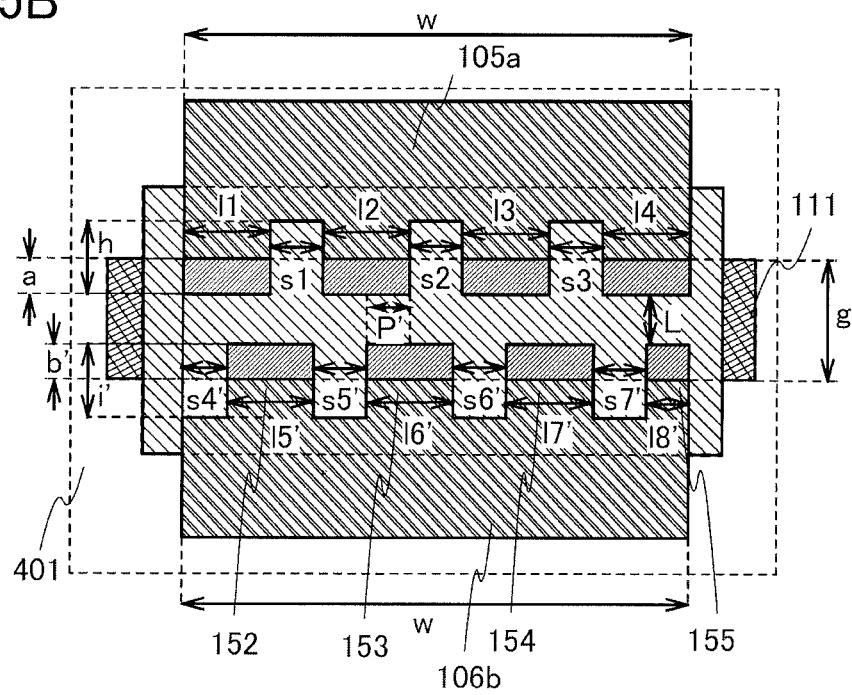

A transistor 401 of Structure B was formed as illustrated in FIG. 5B. Specifically, the interval L between an end of a source electrode layer 105a (comb-shaped electrode layer) and an end of a drain electrode layer 106b (comb-shaped electrode layer) was 3 µm. The width w of the source electrode layer 105a (the width w of the drain electrode layer 106b) was 50 µm. Each of the widths l1, l2, l3, l4, l5', l6', and l7' of electrode tooth portions was 3 µm, and the width l8' was 1.5 µm. Each of the intervals s1, s2, s3, s5', s6', and s7' between the electrode tooth portions was 3 µm, and the interval s4' was 1.5 µm. The length h (i') of each of the electrode tooth portions of the source electrode layer 105a (the drain electrode layer 106b) was 2 µm. The length a (b') of an overlap portion between each of the electrode tooth portions of the source electrode layer 105a (the drain electrode layer 106b) and a gate electrode layer 111 was 1.5 µm. The gate width g was 6 µm. The length P' along which the ends of the electrode tooth portions face each other was 1.5 µm.

Figure 6A:
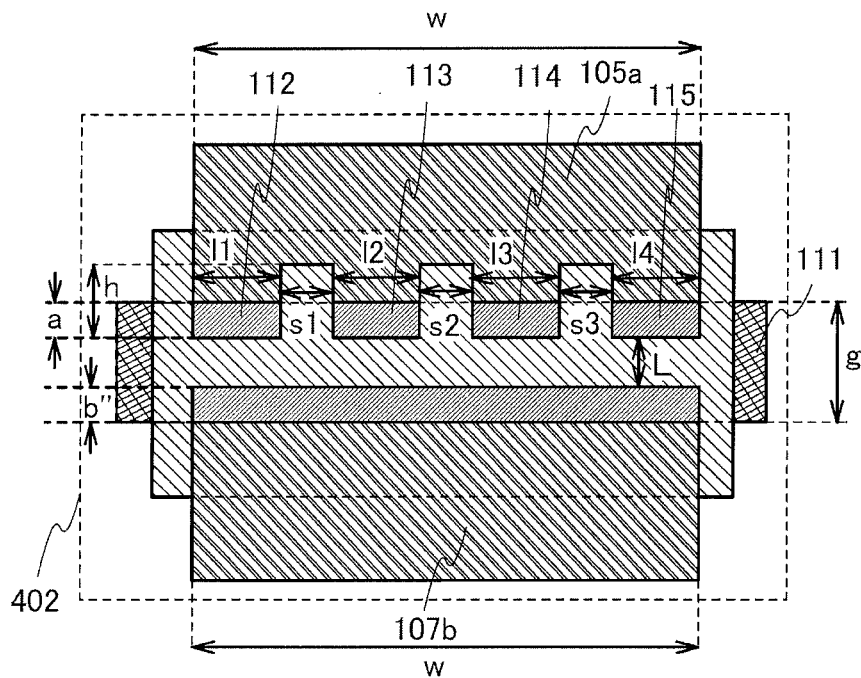
FIGS. 6A and 6B each illustrate a transistor of Example 1.

A transistor 402 of Structure C was formed as illustrated in FIG. 6A. Specifically, the interval L between an end of a source electrode layer 105a (comb-shaped electrode layer) and an end of a drain electrode layer 107b was 3 µm. The width w of the source electrode layer 105a (the width w of the drain electrode layer 107b) was 50 µm. Each of the widths l1, l2, l3, and l4 of electrode tooth portions was 3 µm. Each of the intervals s1, s2, and s3 between the electrode tooth portions was 3 µm. The length h of each of the electrode tooth portions of the source electrode layer 105a was 2 µm. The length a of an overlap portion between each of the electrode tooth portions of the source electrode layer 105a and a gate electrode layer 111 was 1.5 µm. The length b" of an overlap portion between the drain electrode layer 107b and the gate electrode layer 111 was 1.5 µm. The gate width g was 6 µm.

Figure 6B:
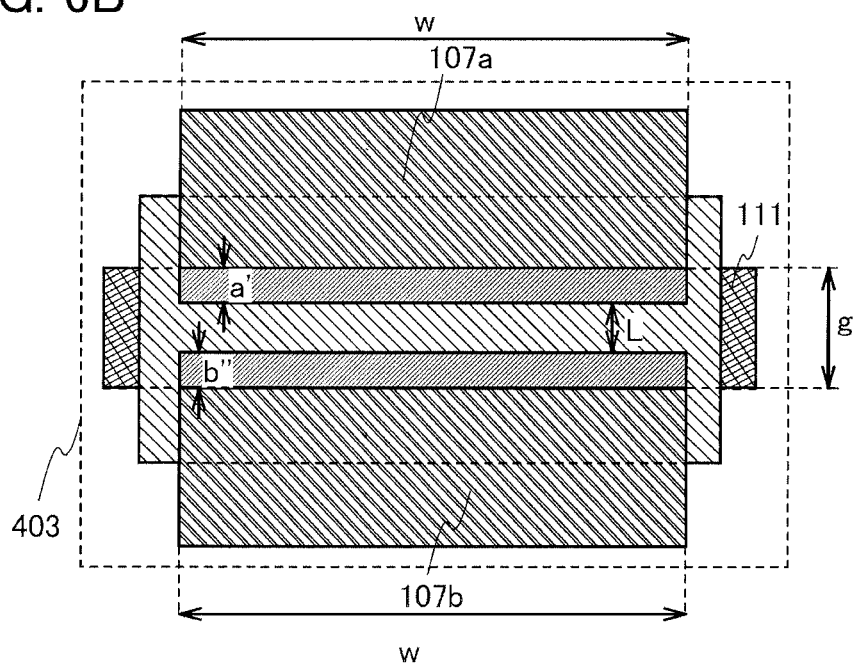

A transistor 403 of a conventional structure was formed as illustrated in FIG. 6B. Specifically, the interval L between an edge of a source electrode layer 107a and an edge of a drain electrode layer 107b was 3 µm. The width w of the source electrode layer 107a (the width w of the drain electrode layer 107b) was 50 µm. The length a' (b") of an overlap portion between the source electrode layer 107a (the drain electrode layer 107b) and a gate electrode layer 111 was 1.5 µm. The gate width g was 6 µm.

It is verified as below by experiment that parasitic capacitance is reduced in three types of transistors each including a source electrode layer and a drain electrode layer having a devised shape, i.e., the transistors 400, 401, and 402, as compared to the transistor 403 of the conventional structure.

The experimental conditions are given below. The parasitic capacitance C generated in the overlap portion between the source electrode layer (the drain electrode layer) and the gate electrode layer of each transistor was measured at a room temperature of 25° C., at a substrate temperature of 25° C., and at VG varying from −20 V to 30 V (in increments of 0.25 V in 201 steps) by using an impedance analyzer (4294A manufactured by Agilent Technologies, Inc.) having four terminals. Two of the four terminals of the impedance analyzer were connected to respective manipulators through respective GPIB cables (manufactured by Agilent Technologies, Inc.). The measurement was performed with a probe placed on only one of the source electrode layer and the drain electrode layer and the other set floating. Calibration was performed before the measurement, and calibration was also performed every time the frequency was changed. For the calibration, all terminals of the manipulator were set to GND. The measurement was performed under four different conditions at frequencies f of 1 MHz, 100 kHz, 10 kHz, and 1 kHz.

Figure 7A:
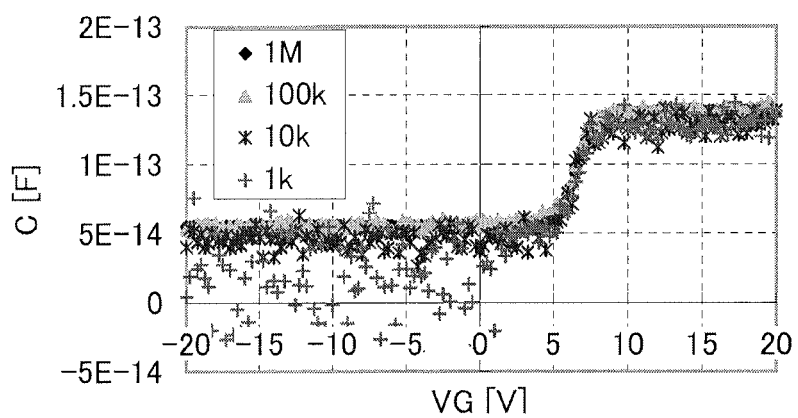
FIGS. 7A to 7D show capacitance characteristics of transistors of Example 1.
Figure 7B:
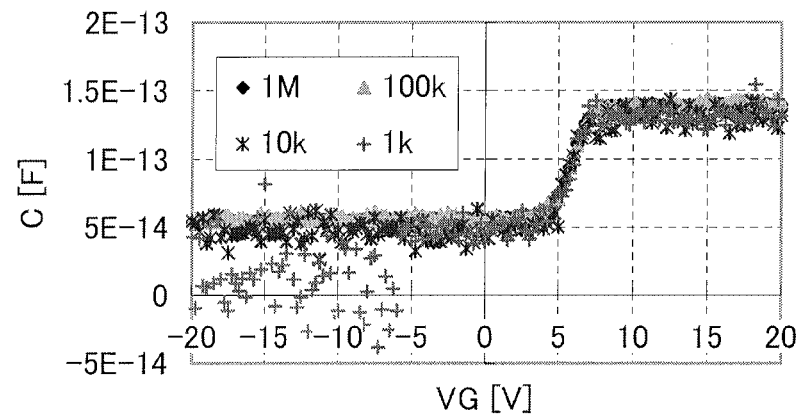
Figure 7C:
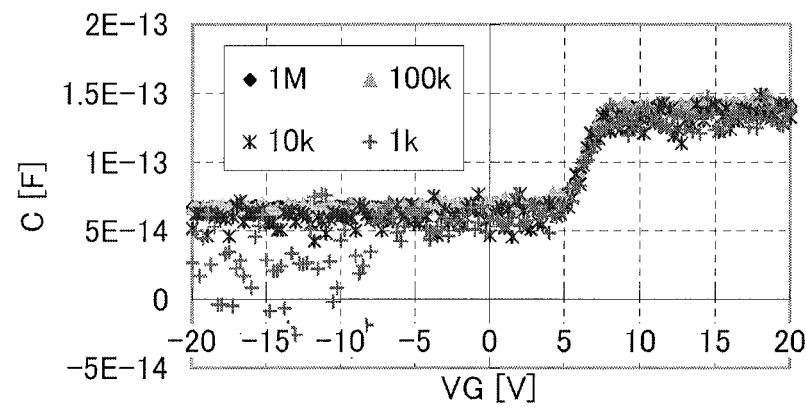

FIGS. 7A to 7D show capacitance characteristics of the transistors, which are obtained from the actually measured parasitic capacitances C generated in the overlap portions between the source electrode layers (the drain electrode layers) and the gate electrode layers of the transistors. FIG. 7A shows capacitance characteristics of the transistor 400 of Structure A; FIG. 7B, the transistor 401 of Structure B; FIG. 7C, the transistor 402 of Structure C; and FIG. 7D, the transistor 403 of the conventional structure.

Figure 7D:
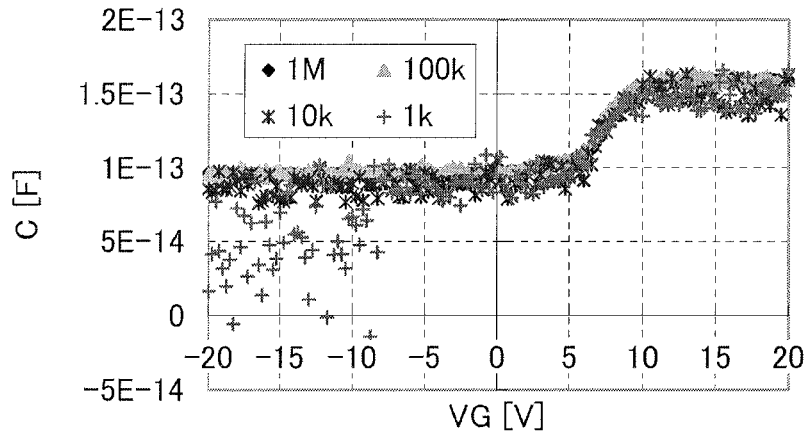

It is confirmed that the parasitic capacitance C in each of FIGS. 7A to 7C is lower than that in FIG. 7D. For example, the parasitic capacitances C of the transistor 400, the transistor 401, the transistor 402, and the transistor 403 of the conventional structure are $5.50 \times 10^{-14}$ F, $5.41 \times 10^{-14}$ F, $6.74 \times 10^{-14}$ F, and $9.63 \times 10^{-14}$ F, respectively, when measured at a frequency of 1 MHz and at VG of $-20$ V. Furthermore, the parasitic capacitances C of the transistor 400, the transistor 401, the transistor 402, and the transistor 403 of the conventional structure are $5.54 \times 10^{-14}$ F, $5.57 \times 10^{-14}$ F, $6.81 \times 10^{-14}$ F, and $9.61 \times 10^{-14}$ F, respectively, when measured at a frequency of 1 MHz and at VG of 0 V.

This confirms that the area of the overlap portion between the source electrode layer (the drain electrode layer) and the gate electrode layer of each of the transistors 400 and 401 is about half of that of the transistor 403 of the conventional structure, and that of the transistor 402 is about 3/4 of that of the transistor 403 of the conventional structure, and in a similar manner, the capacitance C of each of the transistors 400 and 401 is also about half of that of the transistor 403 of the conventional structure, and that of the transistor 402 is also about 3/4 of that of the transistor 403 of the conventional structure.

Therefore, it is confirmed that parasitic capacitance can be reduced by decreasing the area of the overlap portion between the source electrode layer (the drain electrode layer) and the gate electrode layer. Furthermore, it is confirmed that the area of the overlap portion between the source electrode layer (the drain electrode layer) and the gate electrode layer is substantially proportional to the parasitic capacitance generated in the overlap portion.

It is verified as below by experiment that there is substantially no difference in on-state current between the transistor 403 of the conventional structure and each of the three types of transistors each including the source electrode layer and the drain electrode layer having a devised shape, i.e., the transistors 400, 401, and 402.

The experimental conditions are given below. The on-state current ID (which means a current flowing between the source electrode layer and the drain electrode layer) of each transistor was measured at a room temperature of 25° C., at a substrate temperature of 25° C., at VG varying from $-20$ V to 20 V (in increments of 0.2 V in 201 steps), and at VDS of 1 V by using a semiautomatic prober (4155B).

Figure 8A:
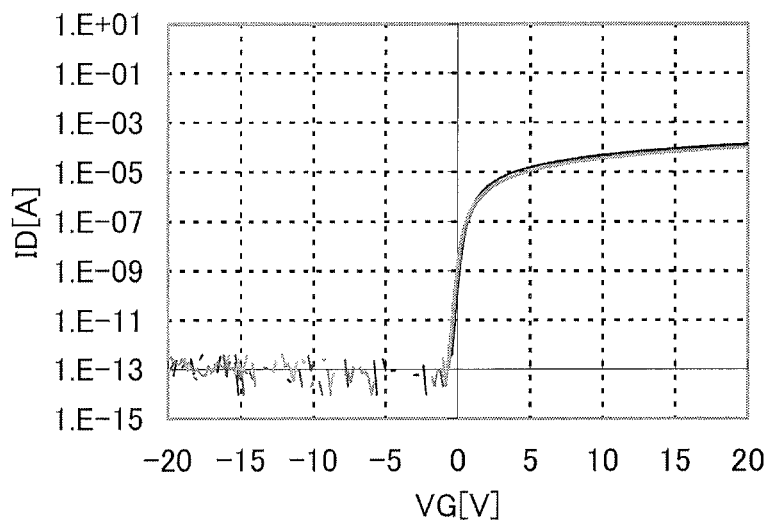
FIGS. 8A and 8B show current characteristics of transistors of Example 1.
Figure 8B:
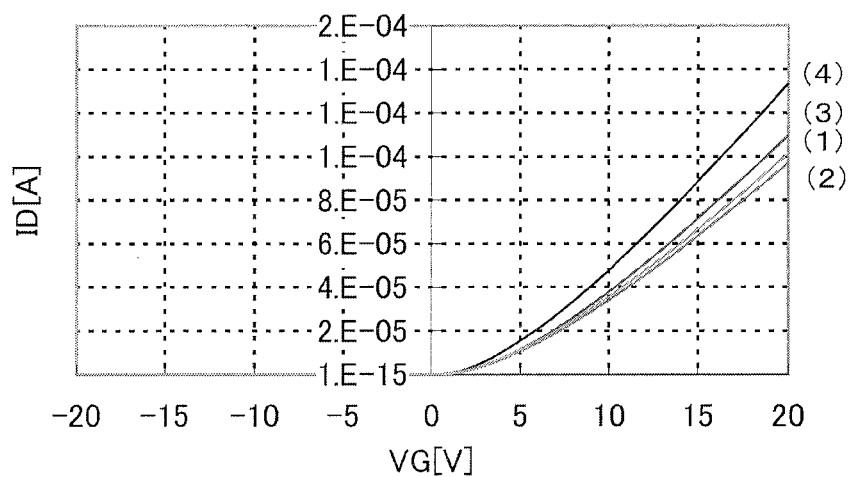

FIGS. 8A and 8B each show current characteristics of the transistors, which are obtained from the actually measured on-state currents of the transistors. FIG. 8A is obtained by converting the y-axis of FIG. 8B to a logarithmic scale. In FIG. 8B, (1), (2), (3), and (4) represent current characteristics of the transistor 400 of Structure A, the transistor 401 of Structure B, the transistor 402 of Structure C, and the transistor 403 of the conventional structure, respectively.

It can be confirmed from FIGS. 8A and 8B that there is substantially no difference in on-state current between the transistor 403 of the conventional structure and each of the three types of transistors including the source electrode layer and the drain electrode layer having a devised shape, i.e., the transistors 400, 401, and 402. For example, the on-state currents ID (1), (2), (3), and (4) of the transistor 400, the transistor 401, the transistor 402, and the transistor 403 of the conventional structure are $10.1 \times 10^{-5}$ A, $9.69 \times 10^{-5}$ A, $11.0 \times 10^{-5}$ A, and $13.35 \times 10^{-5}$ A, respectively, when measured at VG of 20 V.

This confirms that although a slight decrease in on-state current is caused by a decrease in the area of the overlap portion between the source electrode layer (the drain electrode layer) and the gate electrode layer, the decrease is approximately several percent.

This indicates that it is possible to generate, in the transistors 400, 401, and 402, curved current flowing so as to surround the electrode tooth portions, in an amount sufficient to compensate for a decrease in linear current due to a reduction in parasitic capacitance. In other words, it is indicated that, by using a source (drain) electrode layer in a comb shape instead of a rectangular shape, on-sate current can be kept unchanged even when the width of a channel formation region is decreased. That is, it is confirmed that each of the on-state currents of the transistors 400, 401, and 402 and the transistor 403 of the conventional structure can be considered to depend only on the length of the channel formation region.

Therefore, it is confirmed that in a transistor including a source electrode layer and a drain electrode layer having a devised shape, on-state current can be substantially maintained even when parasitic capacitance generated in an overlap portion between the source electrode layer (the drain electrode layer) and a gate electrode layer is reduced.

This application is based on Japanese Patent Application serial no. 2010-088634 filed with Japan Patent Office on Apr. 7, 2010, the entire contents of which are hereby incorporated by reference.

The invention claimed is:

1. A transistor comprising:
   a gate electrode layer;
   a gate insulating layer in contact with the gate electrode layer;
   a semiconductor layer overlapping with the gate electrode layer with the gate insulating layer interposed between the semiconductor layer and the gate electrode layer;
   a source electrode layer in a comb shape, including electrode tooth portions arranged adjacently at a predetermined interval and a connection portion for connecting the electrode tooth portions; and
   a drain electrode layer in a comb shape, including electrode tooth portions arranged adjacently at a predetermined interval and a connection portion for connecting the electrode tooth portions,
   wherein the source electrode layer and the drain electrode layer are disposed such that the electrode tooth portions of the source electrode layer and the electrode tooth portions of the drain electrode layer face each other without interdigitating with each other,
   wherein a part of an end of a first electrode tooth portion of the electrode tooth portions of one of the source and drain electrode layers and a part of the connection portion adjacent to the first electrode tooth portion face an end of one of the electrode tooth portions of the other of the source and drain electrode layers, wherein the end of the first electrode tooth portion overlaps the gate electrode layer, and wherein the connection portion does not overlap the gate electrode layer.

2. The transistor according to claim 1, wherein an edge of the source electrode layer is in contact with the semiconductor layer and overlaps with the gate electrode layer with the gate insulating layer and the semiconductor layer interposed therebetween, and wherein an edge of the drain electrode layer is in contact with the semiconductor layer and overlaps with the gate electrode layer with the gate insulating layer and the semiconductor layer interposed therebetween.

3. The transistor according to claim 2, wherein the semiconductor layer comprises an oxide semiconductor.

4. The transistor according to claim 1, wherein the connection portion of the source electrode layer and the gate electrode layer do not overlap with each other, and wherein the connection portion of the drain electrode layer and the gate electrode layer do not overlap with each other.

5. The transistor according to claim 1, wherein a sum of widths of ends of the electrode tooth portions of the source electrode layer is 3/8 to 1/1 of a width of the source electrode layer and 3/8 to 8/3 of a width of the drain electrode layer.

6. The transistor according to claim 1, wherein a sum of widths of ends of the electrode tooth portions of the drain electrode layer is 3/8 to 1/1 of a width of the drain electrode layer and 3/8 to 8/3 of a width of the source electrode layer.

7. The transistor according to claim 1, wherein an interval between adjacent electrode tooth portions of at least one of the source electrode layer and the drain electrode layer is greater than 0 μm and less than or equal to 5 μm.

8. A transistor comprising:

a gate electrode layer;

a gate insulating layer in contact with the gate electrode layer;

a semiconductor layer overlapping with the gate electrode layer with the gate insulating layer interposed between the semiconductor layer and the gate electrode layer;

a source electrode layer in a comb shape, including electrode tooth portions arranged adjacently at a predetermined interval and a connection portion for connecting the electrode tooth portions; and a drain electrode layer in a comb shape, including electrode tooth portions arranged adjacently at a predetermined interval and a connection portion for connecting the electrode tooth portions, wherein the source electrode layer and the drain electrode layer are disposed such that the electrode tooth portions of the source electrode layer and the electrode tooth portions of the drain electrode layer face each other, wherein a part of an end of a first electrode tooth portion of the electrode tooth portions of one of the source and drain electrode layers and a part of the connection portion adjacent to the first electrode tooth portion face an end of one of the electrode tooth portions of the other of the source and drain electrode layers, wherein the end of the first electrode tooth portion overlaps the gate electrode layer, and wherein the semiconductor layer comprises an oxide semiconductor.

9. The transistor according to claim 8, wherein an edge of the source electrode layer is in contact with the semiconductor layer and overlaps with the gate electrode layer with the gate insulating layer and the semiconductor layer interposed therebetween, and wherein an edge of the drain electrode layer is in contact with the semiconductor layer and overlaps with the gate electrode layer with the gate insulating layer and the semiconductor layer interposed therebetween.

10. The transistor according to claim 8, wherein the oxide semiconductor comprises In and Zn.

11. The transistor according to claim 8, wherein the connection portion of the source electrode layer and the gate electrode layer do not overlap with each other.

12. The transistor according to claim 8, wherein a sum of widths of ends of the electrode tooth portions of the source electrode layer is 3/8 to 1/1 of a width of the source electrode layer and 3/8 to 8/3 of a width of the drain electrode layer.

13. The transistor according to claim 8, wherein an interval between adjacent electrode tooth portions of the source electrode layer is greater than 0 μm and less than or equal to 5 μm.

14. The transistor according to claim 10, wherein the oxide semiconductor comprises Ga.

15. A transistor comprising:

a gate electrode layer;

a gate insulating layer over the gate electrode layer;

a semiconductor layer over the gate insulating layer;

a source electrode layer in a comb shape over the semiconductor layer, including electrode tooth portions arranged adjacently at a predetermined interval and a connection portion for connecting the electrode tooth portions; and a drain electrode layer in a comb shape over the semiconductor layer, including electrode tooth portions arranged adjacently at a predetermined interval and a connection portion for connecting the electrode tooth portions, wherein the source electrode layer and the drain electrode layer are disposed such that the electrode tooth portions of the source electrode layer and the electrode tooth portions of the drain electrode layer face each other, wherein a part of an end of a first electrode tooth portion of the electrode tooth portions of one of the source and drain electrode layers and a part of the connection portion adjacent to the first electrode tooth portion face an end of one of the electrode tooth portions of the other of the source and drain electrode layers, wherein the end of the first electrode tooth portion overlaps the gate electrode layer, and wherein the semiconductor layer comprises an oxide semiconductor.

16. The transistor according to claim 15, wherein an edge of the source electrode layer is in contact with the semiconductor layer and overlaps with the gate electrode layer with the gate insulating layer and the semiconductor layer interposed therebetween, and wherein an edge of the drain electrode layer is in contact with the semiconductor layer and overlaps with the gate electrode layer with the gate insulating layer and the semiconductor layer interposed therebetween.

17. The transistor according to claim 15, wherein the oxide semiconductor comprises In and Zn.

18. The transistor according to claim 15, wherein the connection portion of the source electrode layer and the gate electrode layer do not overlap with each other.

19. The transistor according to claim 15 wherein a sum of widths of ends of the electrode tooth portions of the source electrode layer is 3/8 to 1/1 of a width of the source electrode layer and 3/8 to 8/3 of a width of the drain electrode layer.

20. The transistor according to claim 15, wherein an interval between adjacent electrode tooth portions of the source electrode layer is greater than 0 μm and less than or equal to 5 μm.

21. The transistor according to claim 17, wherein the oxide semiconductor comprises Ga.

22. A device comprising:
a transistor comprising:
- a gate electrode layer;
- a gate insulating layer in contact with the gate electrode layer;
- a semiconductor layer overlapping with the gate electrode layer with the gate insulating layer interposed between the semiconductor layer and the gate electrode layer;
- a source electrode layer in a comb shape, including electrode tooth portions arranged adjacently at a predetermined interval and a connection portion for connecting the electrode tooth portions; and
- a drain electrode layer in a comb shape, including electrode tooth portions arranged adjacently at a predetermined interval and a connection portion for connecting the electrode tooth portions, wherein the source electrode layer and the drain electrode layer are disposed such that the electrode tooth portions of the source electrode layer and the electrode tooth portions of the drain electrode layer face each other, wherein a part of an end of a first electrode tooth portion of the electrode tooth portions of one of the source and drain electrode layers and a part of the connection portion adjacent to the first electrode tooth portion face an end of one of the electrode tooth portions of the other of the source and drain electrode layers, wherein the end of the first electrode tooth portion overlaps the gate electrode layer, and wherein the connection portion does not overlap the gate electrode layer.

23. The device according to claim 22, wherein the device is a liquid crystal display device.

24. The device according to claim 22,
wherein an edge of the source electrode layer is in contact with the semiconductor layer and overlaps with the gate electrode layer with the gate insulating layer and the semiconductor layer interposed therebetween, and wherein an edge of the drain electrode layer is in contact with the semiconductor layer and overlaps with the gate electrode layer with the gate insulating layer and the semiconductor layer interposed therebetween.

25. The transistor according to claim 22, wherein the connection portion of the source electrode layer and the gate electrode layer do not overlap with each other.

26. The transistor according to claim 22, wherein a sum of widths of ends of the electrode tooth portions of the source electrode layer is 3/8 to 1/1 of a width of the source electrode layer and 3/8 to 8/3 of a width of the drain electrode layer.

27. The transistor according to claim 22, wherein an interval between adjacent electrode tooth portions of the source electrode layer is greater than 0 μm and less than or equal to 5 μm.

* * * * *